Figure 1:
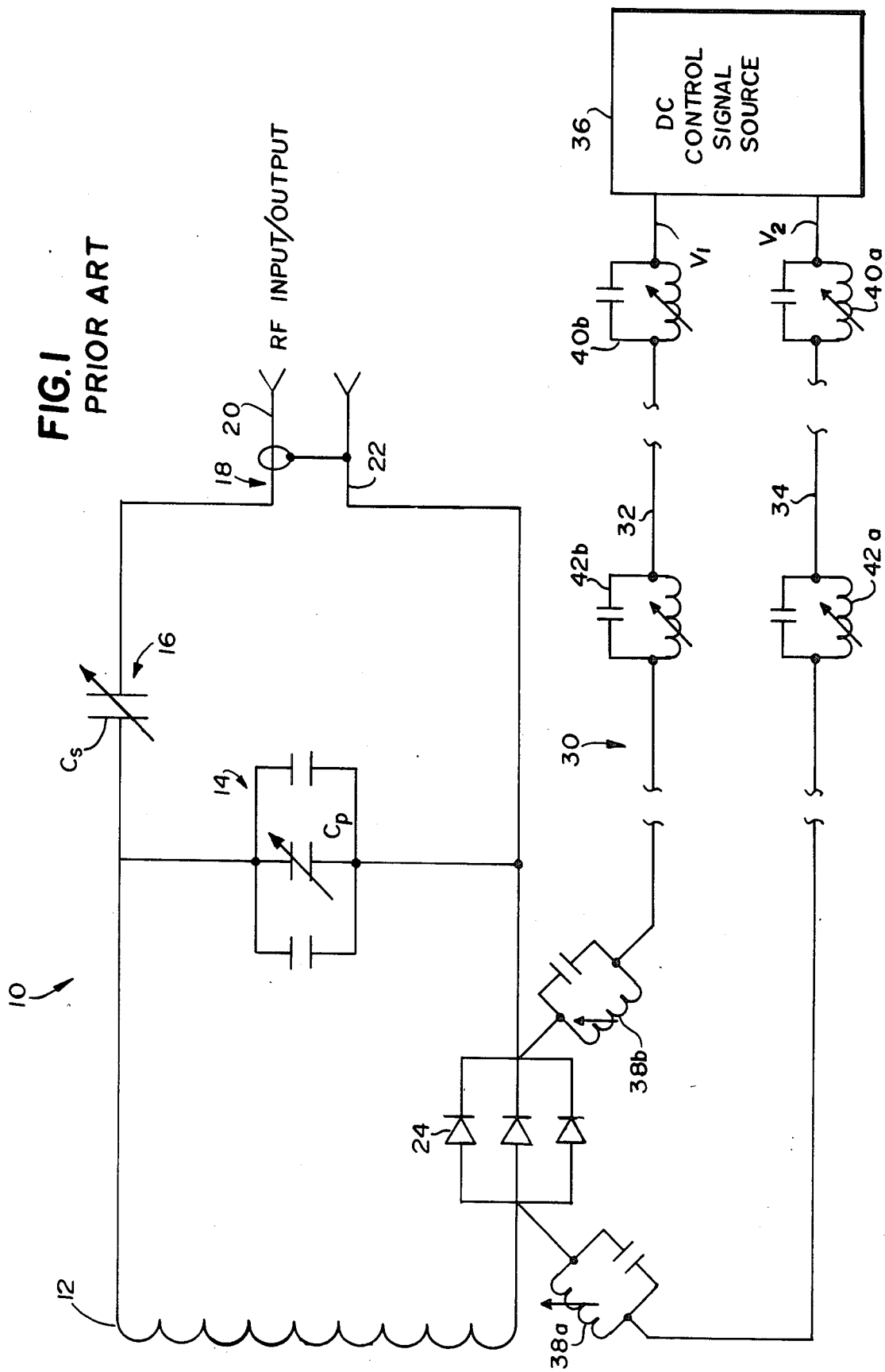

United States Patent [19]

Arakawa et al.

[11] Patent Number: 4,763,076
[45] Date of Patent: Aug. 9, 1988

[54] MRI TRANSMIT COIL DISABLE SWITCHING VIA RF IN/OUT CABLE

[75] Inventors: Mitsuaki Arakawa, Hillsborough; Lawrence E. Crooks, Richmond, both of Calif.

[73] Assignee: The Regents of the University of California, Berkeley, Calif.

[21] Appl. No.: 93,670

[22] Filed: Sep. 8, 1987

Related U.S. Application Data

[63] Continuation-in-part of Ser. No. 91,916, Sep. 1, 1987.

[51] Int. Cl.$^4$ ............................................. G01R 33/20
[52] U.S. Cl. ..................................... 324/322; 324/318
[58] Field of Search ............... 324/300, 307, 309, 318, 324/319, 322; 128/653; 333/12

[56] References Cited

U.S. PATENT DOCUMENTS

| | | | |
|---|---|---|---|
| 4,075,552 | 2/1978 | Traficante | 324/322 |
| 4,129,822 | 12/1978 | Traficante | 324/322 |
| 4,297,637 | 7/1981 | Crooks et al. | 324/309 |
| 4,318,043 | 8/1982 | Crooks et al. | 324/309 |
| 4,471,305 | 4/1984 | Crooks et al. | 324/309 |
| 4,599,565 | 7/1986 | Hoenninger, III et al. | 324/309 |
| 4,602,213 | 7/1986 | Sugiura | 324/307 |
| 4,682,125 | 11/1987 | Harrison et al. | 333/12 |
| 4,712,069 | 12/1987 | Kemner | 324/318 |

OTHER PUBLICATIONS

"Quadrature RF Coil and Decoupling Systems for Mid Field NMR Imaging", Misic et al., vol. 1, *Book of Abstracts, Society of Magnetic Resonance in Medicine*, p. 83, (Aug. 19, 1986).

*Primary Examiner*—Michael J. Tokar
*Attorney, Agent, or Firm*—Nixon & Vanderhye

[57] ABSTRACT

A detuning/decoupling arrangement for a Magnetic Resonance Imaging (MRI) system RF coil arrangement (of the typing using the nuclear magnetic resonance, or NMR, phenomenon) uses switching diodes to selectively connect and disconnect portions of an RF resonant circuit in response to a DC control signal. The DC control signal selectively forward biases and reverse biases the switching diodes. The DC control current is fed to the resonant circuit along the same RF transmission line used to feed RF signals to/from the circuit. An in-line coaxial shielded RF choke connected to the RF transmission line isolates the DC control signals from the RF signals flowing on the same transmission line—reducing the number and complexity of isolation devices required on the ends of the transmission line to separate the RF and DC signals.

11 Claims, 3 Drawing Sheets

MRI TRANSMIT COIL DISABLE SWITCHING VIA RF IN/OUT CABLE

CROSS-REFERENCES TO RELATED APPLICATIONS

This application is a continuation-in-part of commonly-assigned application Ser. No. 91,916 of Arakawa et al filed Sept. 1, 1987 entitled "MRI QD RF Coil Having Diode Switched Detuning Circuit Producing Reduced Artifact", which application is expressly incorporated herein by reference.

This invention is related to the field of magnetic resonance imaging (MRI) utilizing nuclear magnetic resonance (NMR) phenomenon. It is particualarly related to an advantageous selectively detunable RF coil for an MRI system.

This application is generally related to the following commonly-assigned patents of Crooks et al; U.S. Pat. Nos. 4,297,637; 4,318,043; 4,471,305 and 4,599,565. These prior issued patents disclose MRI systems which produce images using the spin echo nuclear magnetic resonance phenomenon.

It may be desirable in MRI systems to use different RF coils for receive and transmit. For example, a large "body" coil may be used to generate a RF field in and around the entire body of a subject to be imaged, and smaller coils (e.g., coils surrounding the head or other body portions to be imaged) may then be used to receive. Such arrangements provide great flexibility, since the same body coil may always be used for transmit, and different receive coils may then be used depending upon the type of images desired (e.g., the body coil can be used to receive if an overall image of a large portion of the subject is desired, a smaller "head coil" surrounding the head of a subject may be used for detailed imaging of the subject's head, or a "surface coil" may be used for imaging other specific body portions such as the chest area).

It is generally known to detune the transmit body coil during the time another coil receives the resulting RF echo pulses. See, for example, Misic et al, "Quadrature RF Coil And Decoupling Systems For Mid Field NMR Imaging," Vol. 1 *Book of Abstracts, Society of Magnetic Resonance in Medicine*, p. 183 (Aug. 19, 1986). It has been recognized in the past that when separate coils are used for transmit and receive, it is necessary to decouple the receive coil system during the transmit portion of the pulse sequence, and to decouple the transmit coil during the receive portion of the sequence.

Detuning the transmit coil during reception by a head or surface coil reduces, but does not entirely eliminate, artifacts and signal loss during receive. It is therefore known to actively open-circuit each loop of the body coil using PIN diodes whenever another coil (e.g., a head or surface coil) is being used for reception (see the Misic et al paper cited above). Misic et al have determined that the results obtained from this type of arrangement compare favorably with the results obtained from independent single coil probe quadrature head and body coils.

FIG. 1 shows one prior art resonant transmit coil arrangement 10 using switching diodes to selectively decouple/detune the coil. Resonant coil arrangement 10 includes an RF coil 12, a parallel tuning capacitor ("$C_p$") 14 connected across the coil, and a series tuning capacitor ("$C_s$") 16 connected in series with the coil. An unbalanced RF transmission line 18 including a center conductor 20 and a shield conductor 22 couple RF signals into (and/or out of) coil arrangement 10. Parallel and series tuning capacitors 14, 16 are adjusted to resonate coil arrangement 10 (that is—the RF circuit formed by RF coil 12, parallel capacitor 14, and series capacitor 16) at a desired frequency of operation (e.g., about 15 MHz for some MRI systems).

One or more switching diodes 24 are. connected somewhere in the resonant circuit defined by arrangement 10 (e.g., between RF coil 12 and parallel tuning capacitor 14). Switching diodes 24 are parallel connected (e.g., with the anodes of each diode connected to RF coil 12 and the cathodes of each diode connected to capacitor 14). Diodes 24 act essentially as closed circuits when they are forward biased (by a DC control signal connected across them having a potential at least as large as the diode "turn-on" voltage), and act as open circuits when they are reverse-biased (by a DC control signal voltage of the opposite polarity of the turn-on voltage connected across them).

When diodes 24 are reversed biased, they break the resonant circuit formed by RF coil 12, parallel tuning capacitor 14 and series tuning capacitor 16 (since a reverse biased diode provides excellent RF signal isolation between its cathode and anode)—causing the arrangement to become detuned and non-resonant (and also decoupled from all other nearby resonant RF circuits). When diodes 24 are forward biased, they conduct RF signals and thus complete the resonant circuit formed by RF coil 12, parallel capacitance 14 and series capacitance 16.

It is necessary to somehow connect a DC control signal across diodes 24 without disrupting or otherwise affecting the RF circuit defined by arrangement 10 and also without coupling RF currents to the source of the DC control signal. Typically, RF coil 12 has a specific shape (e.g., a "saddle" type quadrature RF body coil) which directs the RF fields it emits in specific directions (e.g., in selected directions perpendicular to the so-called "Z axis"). The source of the DC control signal is likely to be damaged if exposed to RF signals—and also is likely to have a very low impedance at radio frequencies and thus act as a short circuit to RF signals. Also, additional conductive structures placed nearby arrangement 10 are likely to receive RF signals radiated by the arrangement and re-radiate those RF signals in undesired and/or unpredictable field directions (thereby degrading the resulting MRI iamge).

Accordingly, it is typical to provide an additional conductive sturcture 30 connected across diodes 24 which provides DC bias signals directly across the diodes but is decoupled from the RF signals flowing on the coil arrangement. DC signals cannot flow around the "loop" formed by coil arrangement 10 due to series tuning capacitor 16, and it is generally undesirable to create a continuous DC path within arrangement 10 because of the likelihood that low frequency eddy currents induced by the strong pulsating magnetic gradient fields will flow along the path (causing component heating and generating spurious magnetic fields). In the FIG. 1 prior art arrangement, additional conductive structure 30 includes first and second DC lines 32, 34 which couple a DC control signal source 36 across diodes 24. Lines 32, 34 typically are insulated single-conductor wires of a sufficient size to carry the current drawn by the diodes and of a length sufficient to run between RF coil 12 and source 36 (the DC source is typically located some distance away from the RF coil to protect it from the strong RF fields which are radiated by the coil during transmit and to avoid interfering with those fields and the static magnetic field which the coil is placed in). DC source 36 includes a current limiting device (e.g., a series resistor) to prevent diodes 24 from drawing excessive current.

One or more RF traps are connected in series with lines 32, 34 to prevent RF from flowing on the lines. These RF traps are parallel tuned resonant circuits (e.g., a small wire-wound low-loss inductor connected in parallel with a lumped capacitance element) which resonate at the frequency of operation of resonant coil arrangement 10—and thus present an extremely high impedance to RF signals at or near that frequency (but a very low resistance to DC signals). These RF traps allow DC but not RF signals to flow along lines 32, 34.

Typically, a first set of series-connected RF traps 38a, 38b are used to connect lines 32, 34, respectively, across diodes 24 (these traps prevent RF from flowing from RF coil 12 into the lines). A second set of RF traps 40a, 40b are connected in series with lines 32, 34 respectively between the lines and the output terminals $V_1$, $V_2$ of DC control signal source 36 (these traps prevent RF picked up by the lines from flowing into the source). A third set of RF traps 42a, 42b typically must be installed in series somwhere along lines 32, 34 to prevent RF signals radiated by RF coil 12 and picked up by the lines from flowing along (and possibly creating RF standing waves on) the lines.

Conductive structure 30 is inconvenient to install and maintain, and may cause image degradation or other problems because of the powerful MRI RF and magnetic gradient fields surrounding it. It is desirable to minimize the number of conductive structures in proximity with RF coil 12 so as to minimize field disturbances. In addition, DC conductors near RF coil 12 are also in proximity to the strong pulsating magnetic gradient fields produced by the MRI magnetic field coils, and are likely to conduct eddy currents in response to these magnetic fields (such eddy currents not only cause conductor heating and energy waste, but also may produce spurious magnetic fields which disturb the gradient magnetic fields). The number of connections to RF coil 12 should also be minimized along with the number of cables running between the coil and other devices. Moreover, the required precise tuning of RF traps 38, 40, 42 can be troublesome and time-consuming.

For these and other reasons, it is highly desirable to entirely eliminate DC conductive structure 30 and instead somehow use RF input/output cable 20 to conduct both RF signals and DC control signals.

Misic et al disclose multiplexing the diode switching control signal with the RF signal over the RF cable connecting the coil with other circuitry in order to avoid the need for special DC conductors in addition to the RF conductor. However, the Misic et al paper does not explain how the same RF cable can be used to conduct both DC switching control signals and RF signals while providing a desired degree of isolation between RF and DC signals at each end of the cable.

The present invention provides an RF resonant circuit connected with one or more siwtching devices (e.g., diodes). The diodes provide a conduction path for RF when they are forward biased by a DC control signal existing across the gap, and open-circuit the RF resonant circuit when reverse-biased.

The DC control signal is connected to the RF resonant circuit via the same RF transmission cable used to couple RF signals to and from the coil. A parallel resonance coaxial shielded tuned RF choke of the type disclosed and claimed in commonly assigned issued U.S. Pat. No. 4,682,125 to Harrison is provided along the RF transmission cable. The choke allows DC signals to flow along the outer conductor outer surface and through the inner conductor of the transmission line. This choke prevents spurious RF signals of certain frequencies from flowing along the outside surface of the outer ("shield") conductor while allowing RF signals at those same frequencies to flow along the outer conductor inside surface. This choke permits RF and DC signals flowing through the same RF coaxial cable to be isolated from one another (e.g., RF signals flow along the inside surface of the coaxial cable outer conductor, and DC signals flow through the outer conductor, including along the outer conductor outer surface). Because of the effectiveness of this in-line choke in preventing spurious RF signals from flowing over the coaxial cable, only minimal, untuned isolation circuitry (e.g., an RF choke) is required at the ends of the transmission line to provide sufficient isolation and separation between RF and DC signals carried by the coaxial cable. Good isolation is provided between the DC and RF circuits even though both DC and RF signals flow through the RF transmission line, and additional RF traps or other isolation devices (e.g., tuned circuits) are generally not required.

Figure 2:
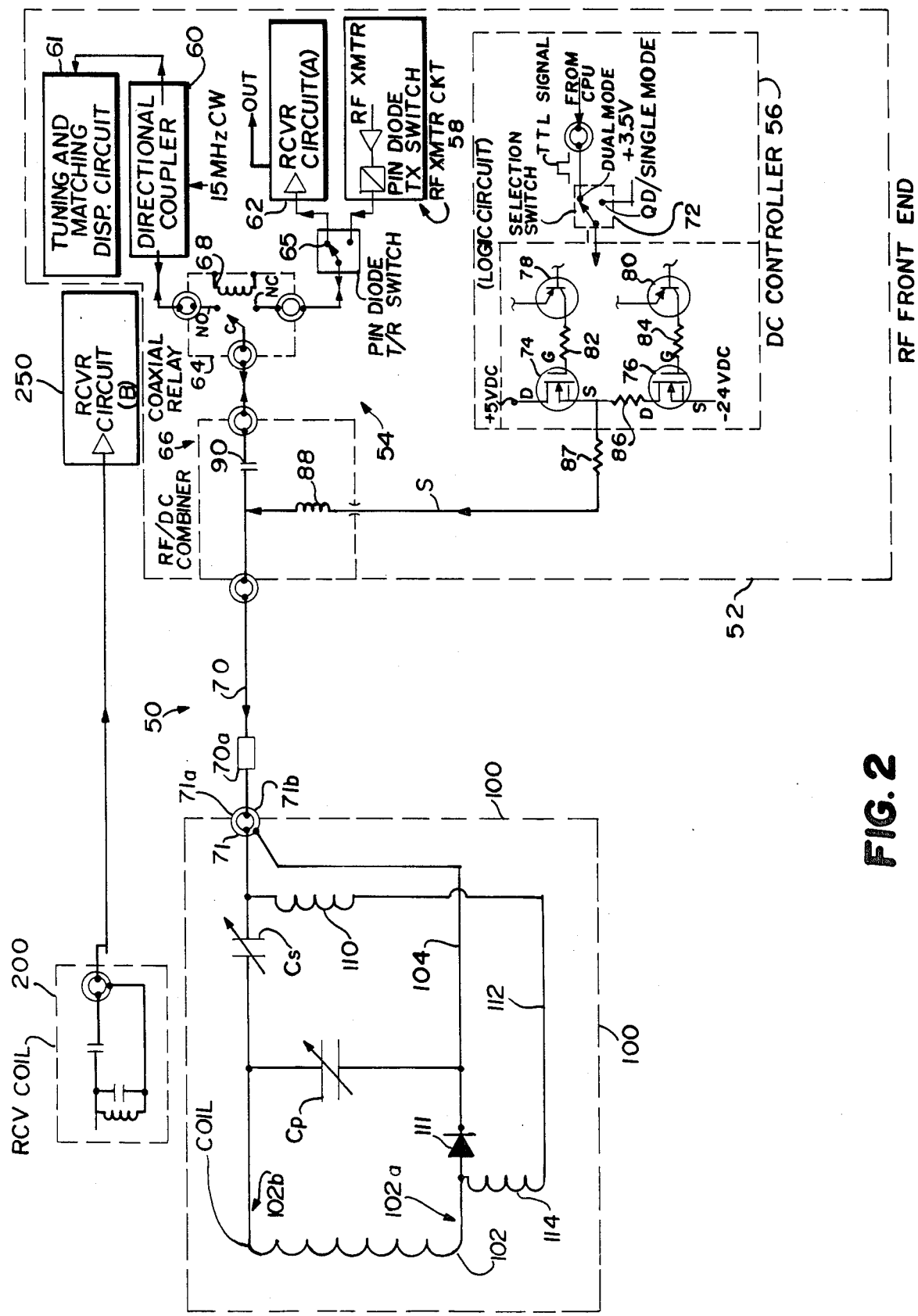
Figure 3:
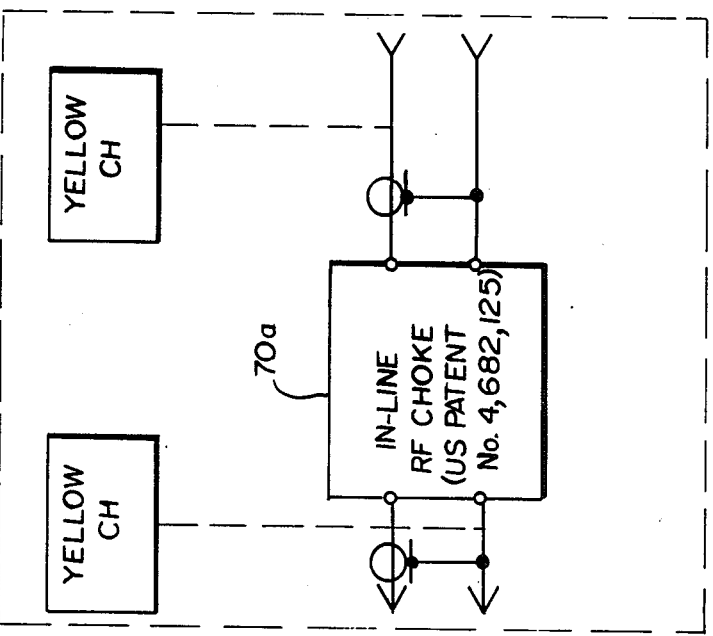
Figure 3:
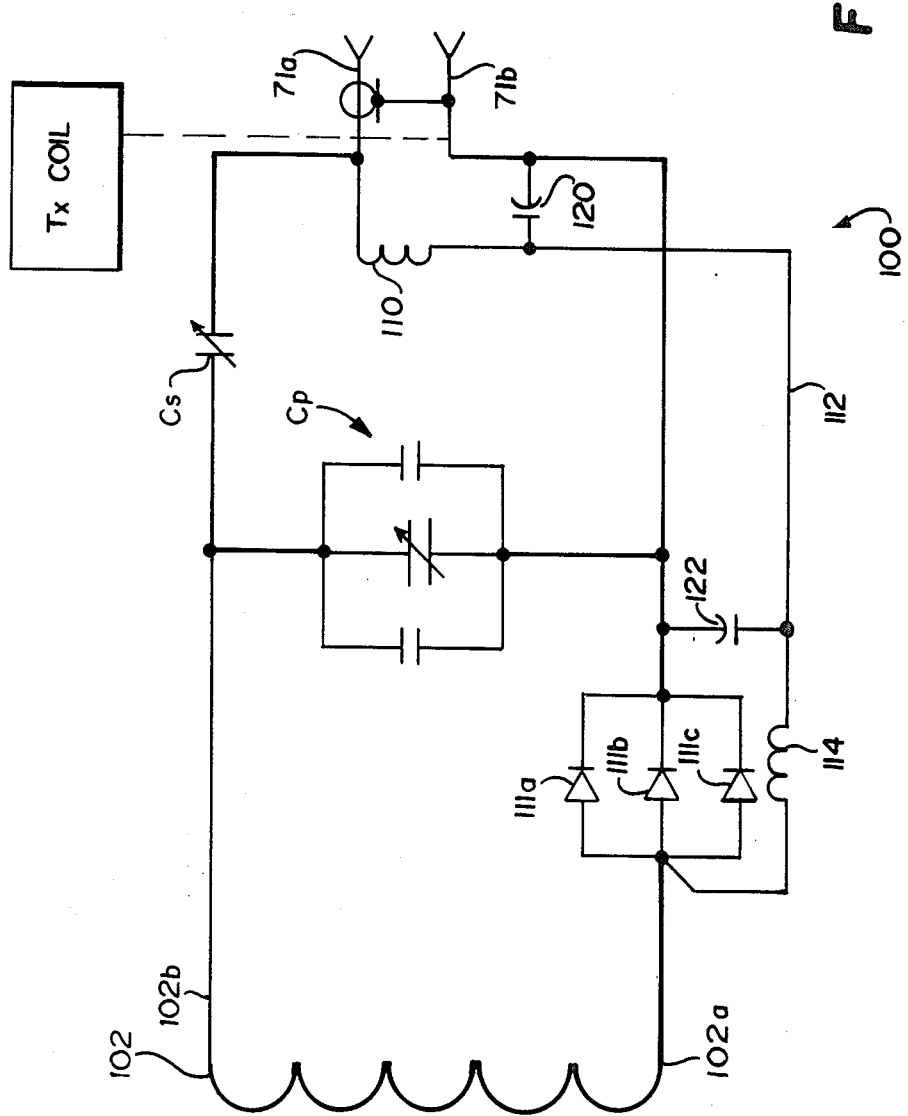

These and other features and advantages of the present invention will be better and more completely understood by referring to the following detailed description of presently preferred exemplary embodiments in conjunction with the appended sheets of drawings, of which:

FIG. 1 is a schematic diagram of a prior art MRI system remotely detunable RF coil arrangement;

FIG. 2 is a schematic diagram of a presently preferred exemplary embodiment of an MRI system 50 including a remotely detunable RF coil arrangement 100, an RF front end 52, and a coaxial feedline structure which conducts both RF and DC signals; and FIG. 3 is a more detailed schematic diagram of the coil arrangement 100 and feedline structure shown in FIG. 2.

FIG. 2 is a schematic diagram of the presently preferred exemplary embodiment of a MRI system 50 in accordance with the present invention. MRI system 50 includes an RF front end 52 connected to a transmitting and/or receiving coil arrangement 100, and a receiving system 200, 250.

As will be explained, coil arrangement 100 includes switching devices which complete a resonant RF circuit (and thus make the coil arrangement operational) in response to a DC control signal S provided by front end 52. When this positive DC control signal S is present, coil arrangement 100 may be used for radiating RF signals provided by front end 52. Alternatively or in addition, coil arrangement 100 provides received RF signals to front end 52 when the DC control signal S is present.

During times when front end 52 does not provide a positive DC control signal to coil arrengement 100, the coil arrangement is detuned so as not to resonate at the RF frequency of operation, and is virtually invisible to other, resonant RF coils operating nearby—for example, recieve coil 200 and associated receiver 250 (since coil arrangement 100 does not provide a complete RF circuit in the preferred embodiment when detuned).

Coil arrangement 100 includes an RF coil 102, series tuning capacitor $C_s$, a parallel tuning capacitor $C_p$, at least one diode 111, RF chokes 110, 114, a DC conductor 112, and an input connector 71 in the preferred embodiment.

Input connector 71 includes a center conductor 71a connected to the center conductor of a coaxial RF cable 70, and an outer conductor 71b connected to the RF cable outer conductor. The input connector center conductor 71a is connected to one side of series tuning capacitor $C_s$, the other side of the series tuning capacitor being connected to RF coil end 102b. The input connector outer conductor 71b is connected to the other end 102a of RF coil 102, and parallel tuning capacitor $C_p$ is connected across the RF coil.

In the preferred embodiment, a bank of PIN diodes 111 (type UM-4902C or KS-1001 in the preferred embodiment) is connected between end 102a or RF coil 102 and parallel tuning capacitor $C_p$, with the anodes of each diode being connected to coil end 102 and the cathodes of each diode being connected to the tuning capacitor.

Diodes 111 are used to selectively connect and disconnect RF coil 102 to parallel tuning capacitor $C_p$ (and to the shield connection 71b of input connector 71) in the preferred embodiment. When diodes 111 are reverse-biased, they act as open circuits to RF (and DC) and cause coil 102 to be electrically disconnected from tuning capacitor $C_p$. When diodes 111 are forward-biased, on the other hand, RF can flow through the diodes and coil 102 is electrically connected to parallel tuning capacitor $C_p$ and to input connector shield 71b.

In the preferred embodiment, RF coil 102 and tuning capacitors $C_s$ and $C_p$ form a resonant RF circuit only when diodes 111 are forward-biased. When diodes 111 are reverse-biased, no RF can flow from RF coil 102 to parallel tuning capacitor $C_p$ and input connector outer conductor 71b, and the RF coil arrangement 102 becomes non-resonant (and thus virtually invisible to other nearby resonant RF coils such as receive coil 200).

In the preferred embodiment, front end 52 includes an RF section 54 and a DC controller section 56. RF section 54 includes an RF transmitter 58, an RF receiver 62, a coaxial relay switch 64, a PIN diode T/R switch ("transmit/receive") 65, an RF/DC combiner circuit 66, a directional coupler 60, and a tuning and matching display circuit 61.

RF transmitter 58 produces high-power RF signals (having a frequency of about 15 MHz in the preferred embodiment) which pass through T/R switch 65 to the normally closed contact NC of relay 64. RF receiver 62 detects RF signals present on the relay 64 normally closed contact NC and passed to the receiver via T/R switch 65, and provides an output signal OUT which is further processed (using conventional MRI signal processing techniques) to produce images.

T/R switch 65 causes a signal path to be created between RF transmitter 58 and RF/DC combiner circuit 66 (via the relay 64 normally closed contact NC) whenever system 50 is in a transmit mode. During receive, T/R switch 65 creates a signal path between RF/DC combiner circuit 66 and the RF input of receiver 62 (also via the relay normally closed contact NC).

The relay 64 normally open (NO) contact is connected to a directional coupler 60 and associated tuning and matching display circuit 61—which are used to initially tune (resonate) coil arrangement 100 prior to detecting image signals. Relay coil 68 is energized during initial system setup so that coupler 60 and display circuit 61 can be used for initial tuning of coil arrangement 100—and is then de-engergized during normal system operation.

DC controller 56 selectively produces DC control signal S which combiner circuit 66 multiplexes with RF signals and applies to a coaxial RF cable 70 (type RG-214 in the preferred embodiment) connecting front end 52 with coil arrangement 100. RF cable 70 in the preferred embodiment includes an RF trap circuit 70a (a "coaxial shielded choke") of the type described in commonly assigned issued U.S. Pat. No. 4,682,125 to Harrison et al (the disclosure of this issued U.S. Patent is expressly incorporated herein by reference) to prevent unwanted spurious secondary RF fields from propagating over and radiating from the outside (outer conductor) of the cable. This in-line coaxials shielded choke permits DC currents to flow through the transmission line outer conductor but prevents RF currents from flowing over this same surface. The coaxial shielded choke permits RF currents to flow on the inner surface of the transmission line outer conductor; and permits both RF and DC currents to flow through the transmission line center conductor.

Controller 56 in the preferred embodiment alternately provides either +2 VDC or −24 VDC to combiner circuit 66—depending upon the setting of a selection switch 72 and also upon whether system 50 is transmitting or receiving. If coil arrangement 100 is being used for both transmit and receive, controller 56 produces a constant +2 VDC—controlling coil arrangement 100 to continuously provide a resonant RF circuit. If coil arrangement 100 is being used for transmit only (and coil 200 is being used for receive), on the other hand, controller 56 produces −24 VDC at all times except when RF transmitter 58 actually produces an RF signal.

In the preferred embodiment, controller 56 includes MOSFETs 74, 76, bipolar junction transistors 78, 80, and resistors 82, 84, 86, 87. The drain of MOSFET 74 is connected to +5 VDC in the preferred embodiment, and the source of this MOSFET is connected through series resistor 86 to the drain of MOSFET 76. The source of MOSFET 76 is connected to −24 VDC in the preferred embodiment. Control line S is connected to the source of MOSFET 74 through a current limiting resistor 87.

The gate of MOSFET 74 is connected through series resistor 82 to the collector of driver transistor 78, and the gate of MOSFET 76 is connected through resistor 84 to the collector of driver transistor 80. Transistors 78, 80 form part of a conventional level converter/logic circuit (not shown) which alternately turns on MOSFETs 74, 76 in response to the control signal level L at the output of switch 72.

In particular, when signal level L is at logic level 1, MOSFET 74 turns ON and MOSFET 76 turns OFF—causing approximately +2 VDC to appear on DC control signal line S. when signal level L is at logic level 0, on the other hand, MOSFET 74 is turned OFF and MOSFET 76 is turned ON to cause approximately −24 VDC to appear on DC control signal line S. RF choke 88 prevents RF signals produced by transmitter 58 or received by coil arrangement 100 over cable 70 from flowing into controller 56, but allows the DC control signal S to flow into combiner circuit 66 and over the cable. DC blocking capacitor 90 prevents the DC control signal S from flowing into relay switch 64.

In the preferred embodiment, coil arrangement 100 defines both a resonant RF path and a DC path—these two paths being co-extensive for part but not all of their lengths.

RF produced by RF transmitter 58 flows through the switch 65, relay 64, DC blocking capacitor 90 and coaxial cable 70 into coil arrangement 100, and then flows through series tuning capacitor $C_s$ and parallel tuning capacitance $C_p$ into RF coil 102. As will be understood by those skilled in the art, the inductive reactance of RF coil 102 and the capacitive reactances of tuning capacitors $C_s$ and $C_p$ form a resonant RF circuit at the common operating frequency of RF transmitter 58 and RF receiver 62. RF signals received by this resonant circuit flow back over cable 70 and through combiner circuit 66, the T/R switch 65, and relay 64 to receiver 62.

The DC current path through RF coil arrangement 100 will now be described. The center conductor of RF coaxial cable 70 is connected (through coaxial choke 70a and a conventional RF connector 71 in the preferred embodiment) to one end of an RF choke 110 in addition to being connected to series tuning capacitor $C_s$. DC control signal S is blocked by tuning capacitor $C_s$, but passes easily through RF choke 110 and flows into DC conductor (e.g., a copper strap) 112. The other end of DC conductor 112 is connected through a second RF choke 114 to the anode of diode bank 111.

RF chokes 110, 114 present relatively low DC resistances so that DC currents can easily flow through them. These RF chokes 110, 114, however, present a high impedance to RF signals—preventing RF from flowing through the chokes (and DC conductor 112). Since the cathodes of diodes 111 are connected directly to parallel tuning capacitor $C_p$ and the input connector outer conductor 71b, both RF and DC signals flow together over a strap 104 connecting diode 111 cathodes, tuning capacitor $C_p$, and input connector outer conductor 71b.

If the voltage of DC control signal S exceeds the diode turn-on voltage (e.g., about 0.7 VDC), the diodes 111 becomes forward biased and conduct RF as well as DC currents. Consequently, when the voltage of DC control signals S is in the positive state (about +2 VDC is preferred embodiment), the DC control signal forward-biases the diodes in bank 111 and DC current (several amperes) flows from input connector inner conductor 71a through DC conductor 112, diodes 111 and back to input connector outer conductor 71b.

FIG. 3 is a more detailed schematic diagram of coil arrangement 100 and transmission line 70. In the preferred embodiment, diode bank 111 includes three (3) parallel-connected discrete type KS-1001 diodes 111a–111c. RF chokes 110, 114 each have an inductance of 10 microhenries and are designed (in a conventional manner) to have low loss. A 180 pF RF bypass capacitor 120 may optionally be connected between RF choke 110 and input connector outer conductor 71b to bypass RF signals, and similarly, a 180 pF RF bypass capacitor 122 may optionally be connected between RF choke 114 and the cathodes of diodes 111. Bypass capacitors 120, 122 ensure that any small stray RF signals present on DC conductor 112 (either due to pickup of radiated RF signals by the conductor or due to leakage of RF signals through chokes 110, 114) are grounded.

The present invention provides a detuning/decoupling MRI RF coil arrangement using switching diodes to selectively detune and decouple (i.e., make non-resonant) the RF resonant circuit in reponse to a DC control signal. The DC control signal selectively forward biases and reverse biases the switching diodes. This DC control signal flows to the coil arrangement along the very same transmission line used to carry RF signals to and from the coil arrangement—a coaxial shielded choke of the type disclosed in commonly-assigned U.S. Pat. No. 4,682,125 to Harrison et al being provided along this transmission line.

The DC control current flows through an RF choke into a DC conductor; through the DC conductor and another RF choke into the diodes; and through the diodes into the RF coil itself (and thus shares some of its path with RF currents). The transmission line coaxial shielded RF choke prevents spurious RF signals from flowing along the outside of the transmission line outer conductor while allowing the DC control signal to flow through this outer conductor. The coaxial shielded RF choke allows desired RF signals to flow on the inside of this outer conductor—thereby isolating from one another RF and DC signals flowing along the same transmission line. The isolation provided by the in-line transmission line choke permits fewer and less complex (e.g., non-tuned) isolation devices to be used on the ends of the transmission line and yet provide adequate decoupling of DC and RF signals.

Although the present invention uses diodes 111 as switching element to alternately close-circuit and open-circuit an RF resonant circuit, diodes 111 could be replaced with virturally any device used to perform control functions in response to a DC control signal. As one example, the DC control signal path provided by the present invention could be used to control the capacitance of a so-called varactor diode in order to remotely tune coil arrangement 100.

While the invention has been described in connection with what is presently considered to be the most practical and preferred embodiments, it is to be usderstood that the invention is not to be limited to the disclosed embodiments, but on the contrary, is intended to cover various modifications and equivalent arrangements included within the spirit and scope of the appended claims.

What is claimed is:

1. Magnetic resonance imaging apparatus comprising:
   resonant RF circuit means for resonating at a predetermined radio frequency;
   transmission line means connected to said RF circuit means for applying a DC control signal to said circuit means and also adapted for conducting RF signals between said transmission line means and an external RF receiver and/or transmitter, said transmission line means including an inner conductor and a substantially cylindrical outer conductor surrounding and coaxial with said inner conductor, said outer conductor having inner and outer surfaces;
   coaxial choke assembly means, disposed along said transmission line means, for preventing RF signals from flowing along said transmission line means outer conductor outer surface and for permitting DC signals to flow along said transmission line means outer conductor outer surface;

means coupled to said RF transmission line means and to said resonant RF circuit means for preventing said resonant circuit means from resonating at said predetermined frequency in response to said DC control signal; and further structure disposed in proximity to said resonant circuit means and connected to said preventing means for conducting said DC control signal but not RF signals between said resonant circuit means and said transmission line means.

2. Magnetic resonance imaging apparatus as in claim 1 wherein said further structure includes a conductor and an RF choke connected between said conductor and said preventing means.

3. Magnetic resonance imaging apparatus as in claim 1 wherein said further structure includes a conductor and an RF choke connected between said conductor and said transmission line means.

4. Magnetic resonance imaging apparatus as in claim 1 wherein said coaxial choke assembly means includes:
 a coiled section of said transmission line means, said coiled section including plural turns and whose outer conductor provides an inductance; and
 a lumped fixed capacitance connected in parallel with said coiled section's outer conductor and providing a capacitance, said inductance and capacitance together resonating at said predetermined radio frequency, said choke assembly means substantially impeding the flow of RF signals via the outer conductor outer surface of said transmission line coiled section.

5. Magnetic resonance imaging apparatus as in claim 4 wherein said coiled section and capacitance are encased within a cylindrical housing.

6. Magnetic resonance imaging apparatus as in claim 1 wherein said preventing means includes at least one switching diode.

7. Magnetic resonance imaging apparatus as in claim 1 wherein said preventing means includes at least one varactor diode.

8. Magnetic resonance imaging apparatus as in claim 1 further including bypass capacitor means coupled to said further structure for bypassing stray RF signals flowing on said further structure.

9. Magnetic resonance imaging apparatus as in claim 1 wherein said resonant circuit means conducts DC control current in a first direction between said transmission line means and said preventing means, and said further structure conducts DC control current in a second direction opposite said first direction between said transmission line means and said preventing means.

10. Magnetic resonance imaging apparatus comprising:
 resonant RF circuit means for resonating at a predetermined radio frequency;
 a coaxial transmission line connected to said RF circuit means, said transmission line means including an inner conductor and a substantially cylindrical outer conductor surrounding and coaxial with said inner conductor, said outer conductor having inner and outer surfaces;
 in-line coaxial choke assembly means connected in series with said transmission line for substantially impeding RF signals flowing along said tranmission line means outer conductor outer surface and for permitting DC signals to flow along said transmission line means outer conductor;
 means coupled to said RF transmission line means and to said resonant RF circuit means for preventing said resonant cirucit means from resonating at said predetermined frequency in response to a DC control signal appearing between said coaxial transmission line inner and outer conductors; and
 an untuned RF circuit means connected between said preventing means and said transmission line for conducting said DC control signal but not RF signals between said preventing means and said transmission line.

11. Magnetic resonance imaging apparatus as in claim 10 wherein said untuned circuit means conducts said DC control signal in a first direction between said preventing means and said transmission line, and a portion of said resonant circuit means conducts said DC control signal in a second direction opposite said first direction between said preventing means and said transmission line.

* * * * *